United States Patent
Farnworth et al.

(10) Patent No.: US 7,288,757 B2
(45) Date of Patent: Oct. 30, 2007

(54) MICROELECTRONIC IMAGING DEVICES AND ASSOCIATED METHODS FOR ATTACHING TRANSMISSIVE ELEMENTS

(75) Inventors: Warren M. Farnworth, Nampa, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/218,126

(22) Filed: Sep. 1, 2005

(65) Prior Publication Data
US 2007/0045515 A1    Mar. 1, 2007

(51) Int. Cl.
*H01J 5/02* (2006.01)
*H01L 21/00* (2006.01)

(52) U.S. Cl. .................. 250/239; 438/64; 438/68; 257/434

(58) Field of Classification Search ........ 250/208.1, 250/239; 257/433, 434, 678, 680; 438/64–68, 438/106, 107, 113, 116
See application file for complete search history.

(56) References Cited

U.S. PATENT DOCUMENTS

| | | | |
|---|---|---|---|
| 3,345,134 A | 10/1967 | Heymer et al. |
| 4,534,100 A | 8/1985 | Lane |
| 4,906,314 A | 3/1990 | Farnworth et al. |
| 5,130,783 A | 7/1992 | McLellan |
| 5,371,397 A | 12/1994 | Maegawa et al. |
| 5,424,573 A | 6/1995 | Kato et al. |
| 5,435,887 A | 7/1995 | Rothschild et al. |
| 5,505,804 A | 4/1996 | Mizuguchi et al. |
| 5,593,913 A | 1/1997 | Aoki |
| 5,605,783 A | 2/1997 | Revelli et al. |
| 5,672,519 A | 9/1997 | Song et al. |
| 5,694,246 A | 12/1997 | Aoyama et al. |
| 5,708,293 A | 1/1998 | Ochi et al. |

(Continued)

FOREIGN PATENT DOCUMENTS

EP    0 886 323    12/1998

(Continued)

OTHER PUBLICATIONS

U.S. Appl. No. 10/785,466, Kirby.

(Continued)

*Primary Examiner*—Thanh X. Luu
(74) *Attorney, Agent, or Firm*—Dickstein Shapiro LLP

(57) ABSTRACT

Microelectronic imaging devices and associated methods for attaching transmissive elements are disclosed. A manufacturing method in accordance with one embodiment of the invention includes providing an imager workpiece having multiple image sensor dies configured to detect energy over a target frequency. The image sensor dies can include an image sensor and a corresponding lens device positioned proximate to the image sensor. The method can further include positioning standoffs adjacent to the lens devices while the image sensor dies are connected to each other via the imager workpiece. At least one transmissive element can be attached to the workpiece at least proximate to the standoffs so the lens devices are positioned between the corresponding image sensors and the at least one transmissive element. Accordingly, the at least one transmissive element can protect the image sensors while the image sensor dies are still connected. In a subsequent process, the image sensor dies can be separated from each other.

6 Claims, 11 Drawing Sheets

U.S. PATENT DOCUMENTS

| | | |
|---|---|---|
| 5,771,158 A | 6/1998 | Yamagishi et al. |
| 5,776,824 A | 7/1998 | Farnworth et al. |
| 5,811,799 A | 9/1998 | Wu |
| 5,821,532 A | 10/1998 | Beaman et al. |
| 5,857,963 A | 1/1999 | Pelchy et al. |
| 5,861,654 A | 1/1999 | Johnson |
| 5,877,040 A | 3/1999 | Park et al. |
| 5,897,338 A | 4/1999 | Kaldenberg |
| 5,914,488 A | 6/1999 | Sone |
| 5,977,535 A | 11/1999 | Rostoker |
| 5,998,862 A | 12/1999 | Yamanaka |
| 6,080,291 A | 6/2000 | Woodruff et al. |
| 6,104,086 A | 8/2000 | Ichikawa et al. |
| 6,114,240 A | 9/2000 | Akram et al. |
| 6,143,588 A | 11/2000 | Glenn |
| 6,236,046 B1 | 5/2001 | Watabe et al. |
| 6,259,083 B1 | 7/2001 | Kimura |
| 6,266,197 B1 | 7/2001 | Glenn et al. |
| 6,274,927 B1 | 8/2001 | Glenn |
| 6,285,064 B1 | 9/2001 | Foster |
| 6,351,027 B1 | 2/2002 | Giboney et al. |
| 6,372,548 B2 | 4/2002 | Bessho et al. |
| 6,407,381 B1 | 6/2002 | Glenn et al. |
| 6,411,439 B2 | 6/2002 | Nishikawa |
| 6,483,652 B2 | 11/2002 | Nakamura |
| 6,503,780 B1 | 1/2003 | Glenn et al. |
| 6,541,762 B2 | 4/2003 | Kang et al. |
| 6,566,745 B1 | 5/2003 | Beyne et al. |
| 6,603,183 B1 | 8/2003 | Hoffman |
| 6,617,623 B2 | 9/2003 | Rhodes |
| 6,661,047 B2 | 12/2003 | Rhodes |
| 6,667,551 B2 | 12/2003 | Hanaoka et al. |
| 6,670,986 B1 | 12/2003 | Ben Shoshan et al. |
| 6,686,588 B1 | 2/2004 | Webster et al. |
| 6,703,310 B2 | 3/2004 | Mashino et al. |
| 6,864,172 B2 | 4/2004 | Noma et al. |
| 6,734,419 B1 | 5/2004 | Glenn et al. |
| 6,759,266 B1 | 7/2004 | Hoffman |
| 6,774,486 B2 | 8/2004 | Kinsman |
| 6,778,046 B2 | 8/2004 | Stafford et al. |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,813,154 B2 | 11/2004 | Diaz et al. |
| 6,825,458 B1 | 11/2004 | Moess et al. |
| 6,828,663 B2 | 12/2004 | Chen et al. |
| 6,828,674 B2 | 12/2004 | Karpman |
| 6,844,978 B2 | 1/2005 | Harden et al. |
| 6,882,021 B2 | 4/2005 | Boon et al. |
| 6,885,107 B2 | 4/2005 | Kinsman |
| 6,934,065 B2 | 8/2005 | Kinsman |
| 6,946,325 B2 | 9/2005 | Yean et al. |
| 2002/0006687 A1 | 1/2002 | Lam |
| 2002/0057468 A1 | 5/2002 | Segawa et al. |
| 2002/0089025 A1 | 7/2002 | Chou |
| 2002/0092968 A1 | 7/2002 | Hula et al. |
| 2002/0096729 A1 | 7/2002 | Tu et al. |
| 2002/0113296 A1 | 8/2002 | Cho et al. |
| 2002/0145676 A1 | 10/2002 | Kuno et al. |
| 2003/0062601 A1 | 4/2003 | Harnden et al. |
| 2004/0002179 A1 | 1/2004 | Barton et al. |
| 2004/0012698 A1 | 1/2004 | Suda et al. |
| 2004/0017000 A1* | 1/2004 | Chiu et al. ............ 257/678 |
| 2004/0023469 A1 | 2/2004 | Suda |
| 2004/0038442 A1 | 2/2004 | Kinsman |
| 2004/0041261 A1 | 3/2004 | Kinsman |
| 2004/0082094 A1 | 4/2004 | Yamamoto |
| 2004/0124486 A1* | 7/2004 | Yamamoto ............ 257/433 |
| 2004/0214373 A1 | 10/2004 | Jiang et al. |
| 2004/0245649 A1 | 12/2004 | Imaoka |
| 2005/0041134 A1 | 2/2005 | Takayama |
| 2005/0052751 A1 | 3/2005 | Liu et al. |
| 2005/0104228 A1 | 5/2005 | Rigg et al. |
| 2005/0110107 A1* | 5/2005 | Yamamoto et al. ......... 257/433 |
| 2005/0110889 A1 | 5/2005 | Tuttle et al. |
| 2005/0127478 A1 | 6/2005 | Hiatt et al. |
| 2005/0151228 A1 | 7/2005 | Tanida et al. |
| 2005/0185088 A1 | 8/2005 | Kale et al. |
| 2005/0233499 A1* | 10/2005 | Okuda et al. ............. 438/118 |
| 2005/0236708 A1 | 10/2005 | Farnworth et al. |
| 2005/0254133 A1 | 11/2005 | Akram et al. |
| 2006/0001147 A1* | 1/2006 | Tomita et al. ............. 257/690 |
| 2006/0290001 A1 | 12/2006 | Sulfridge |

FOREIGN PATENT DOCUMENTS

| | | |
|---|---|---|
| EP | 1 157 967 A2 | 11/2001 |
| EP | 1 705 706 A | 9/2006 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| JP | 2003 12595 A | 4/2003 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.

Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, In., M3D™ Technology, Maskless Mesoscale Materials Deposition (M3D), 1 page, <http://www.optomec.com/html/m3d.htm>, retrievedfrom the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

Partial International Search Report dated May 8, 2007.

International Search Report dated Aug. 22, 2007.

* cited by examiner

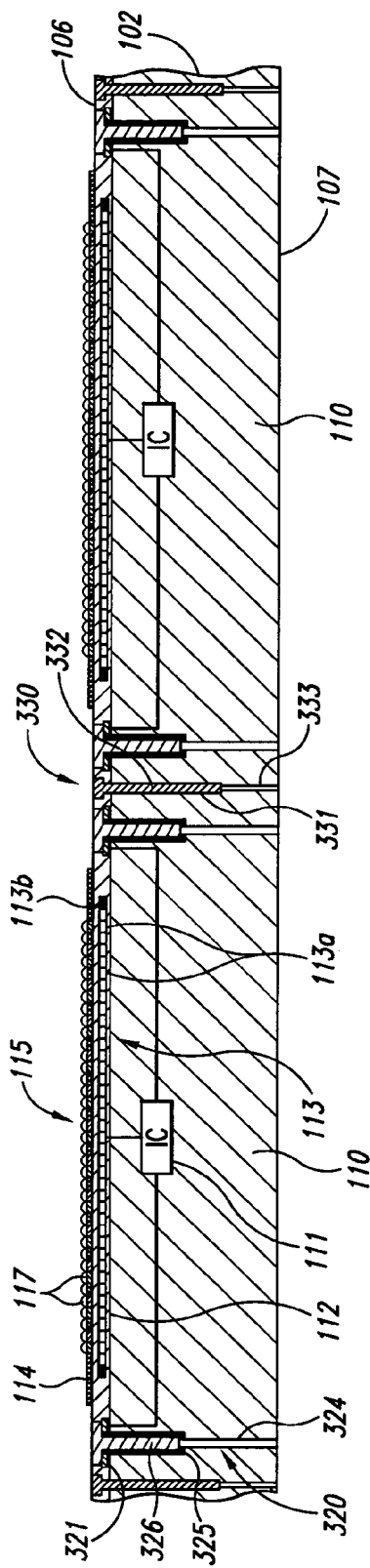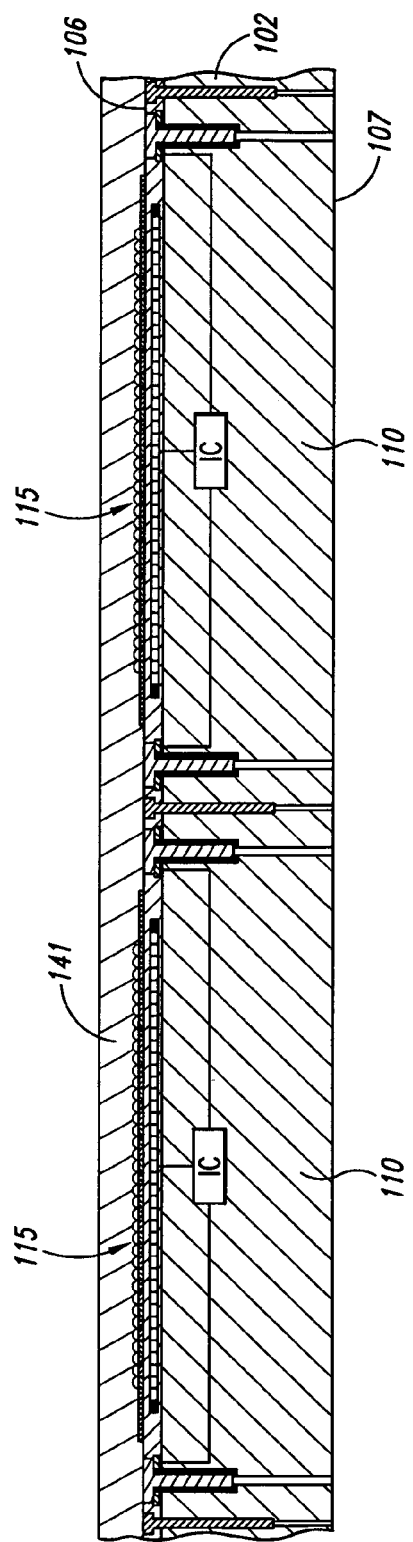
Fig. 3A
Fig. 3B

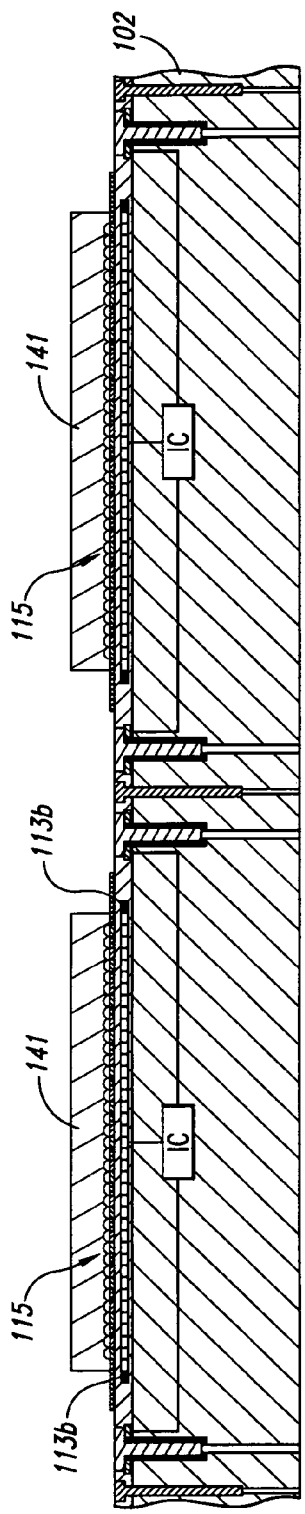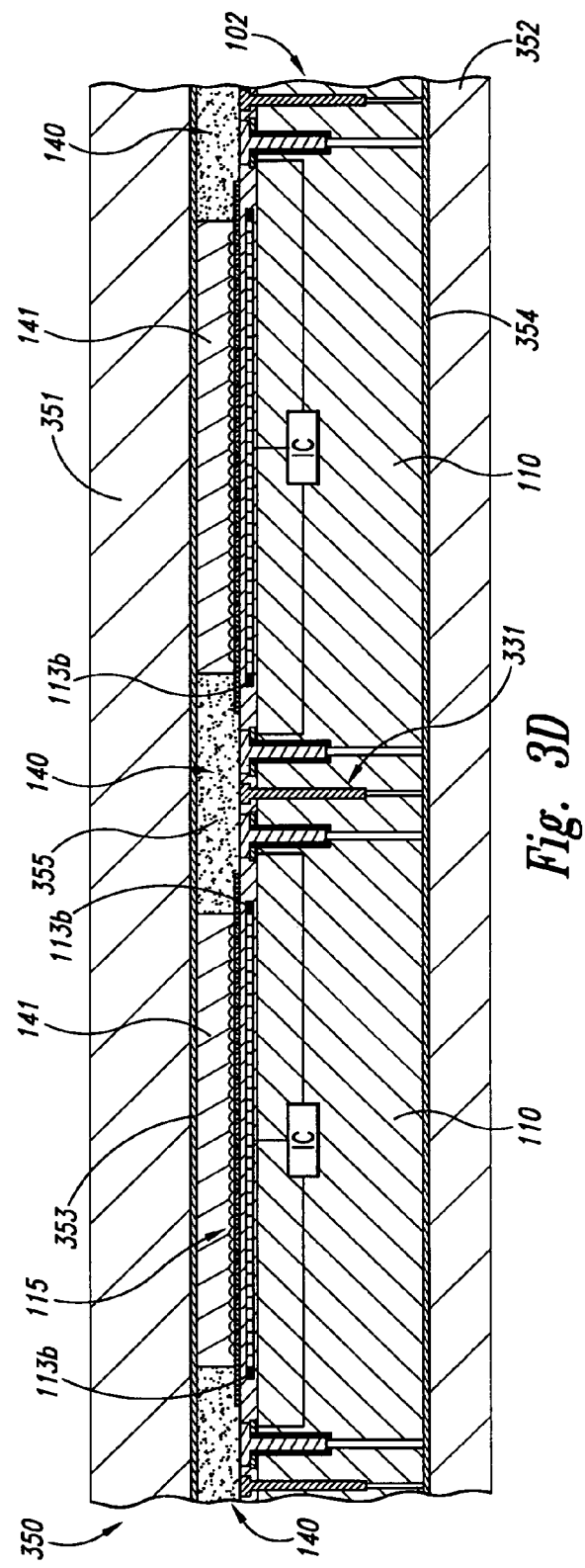

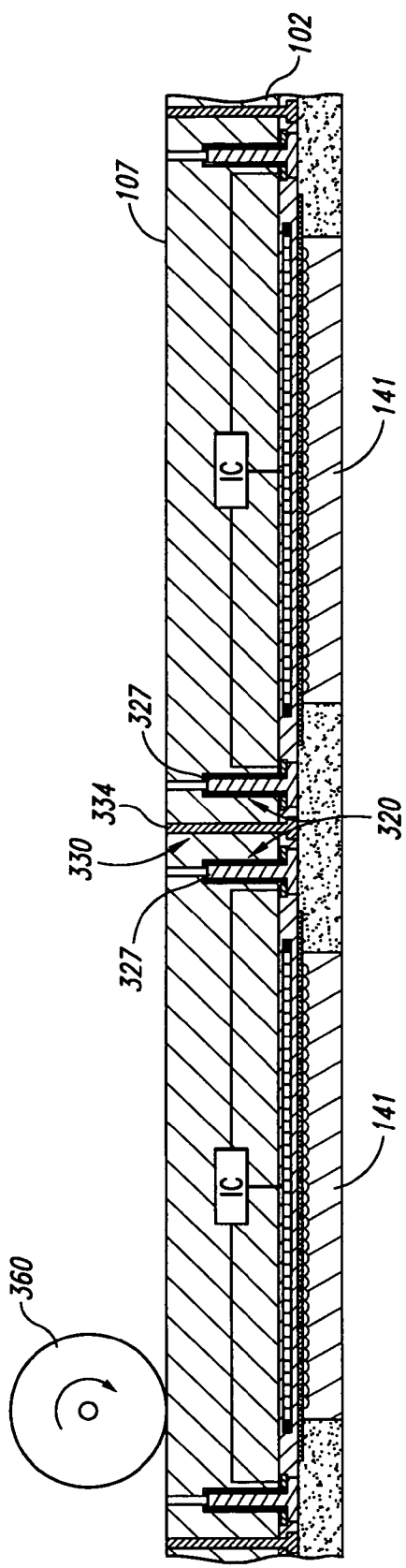
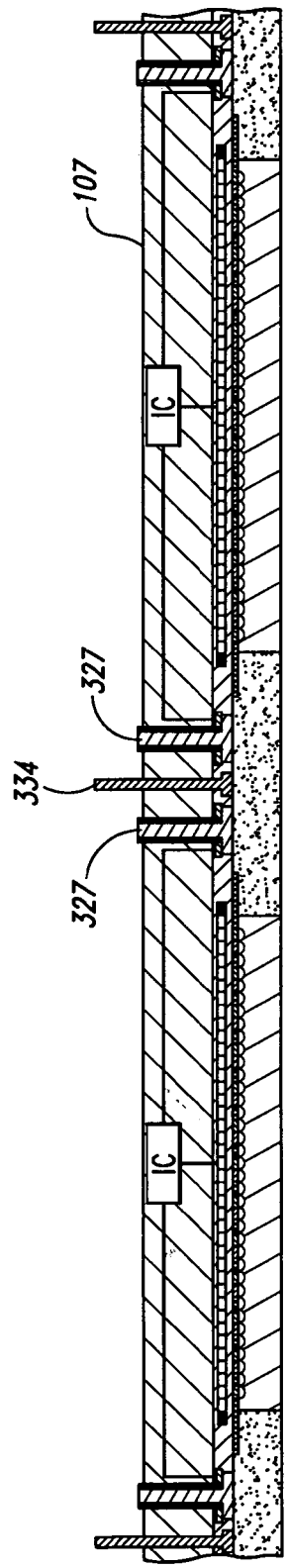
Fig. 3E
Fig. 3F

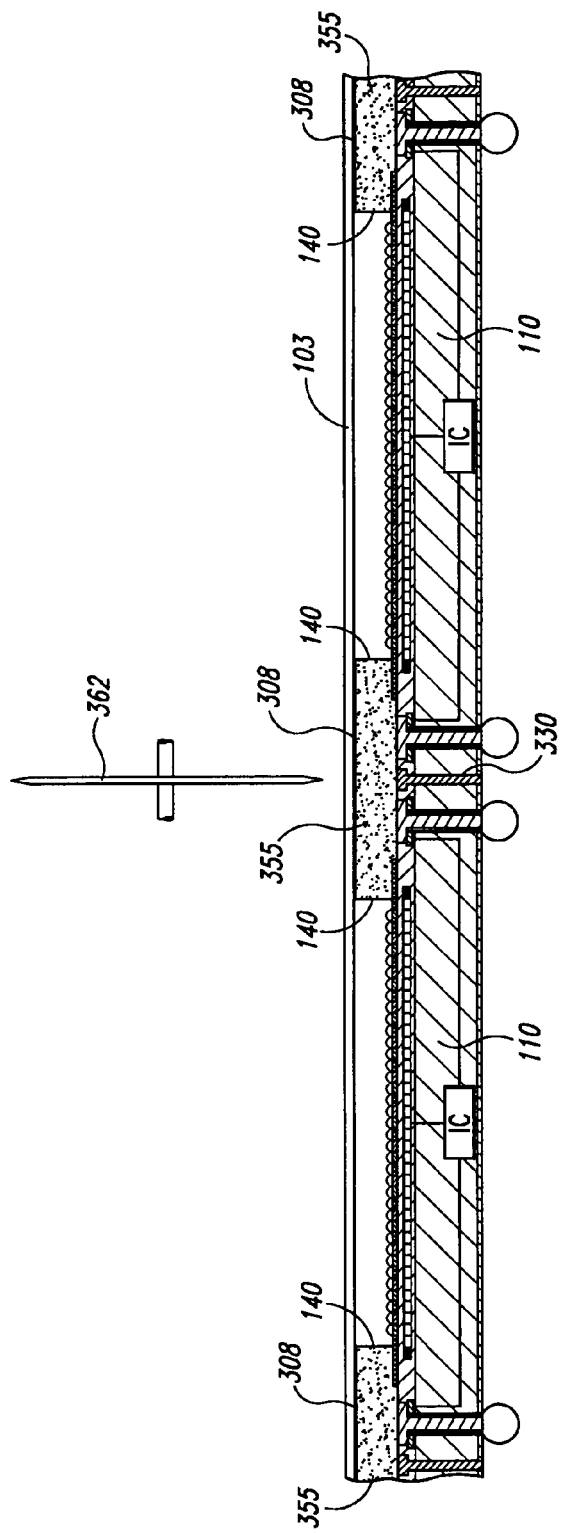
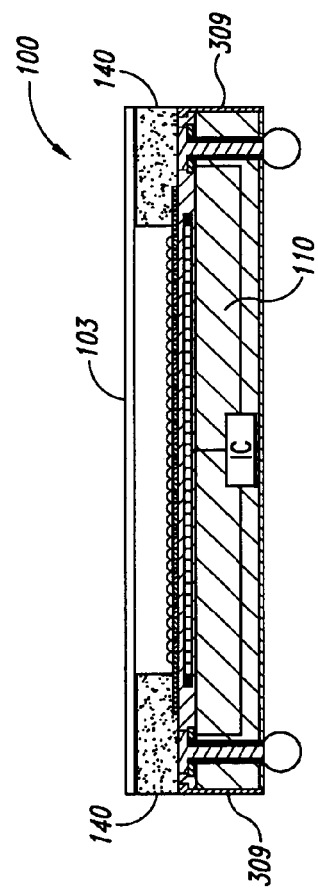
Fig. 3J
Fig. 3K

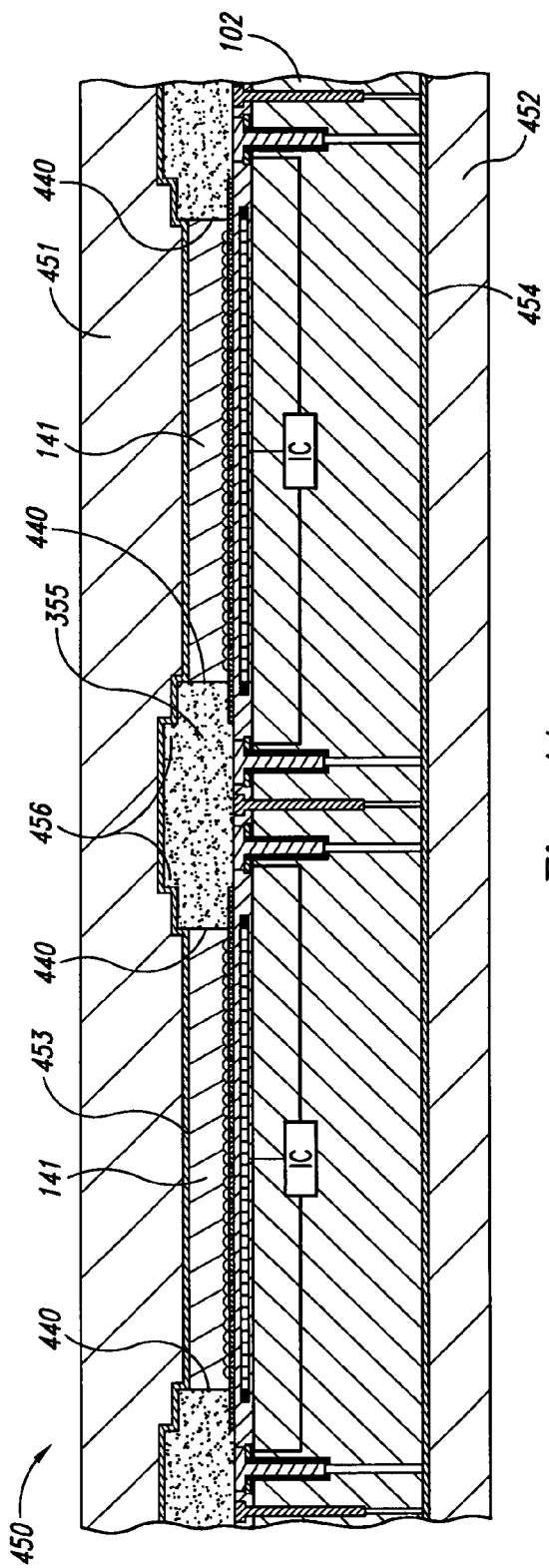
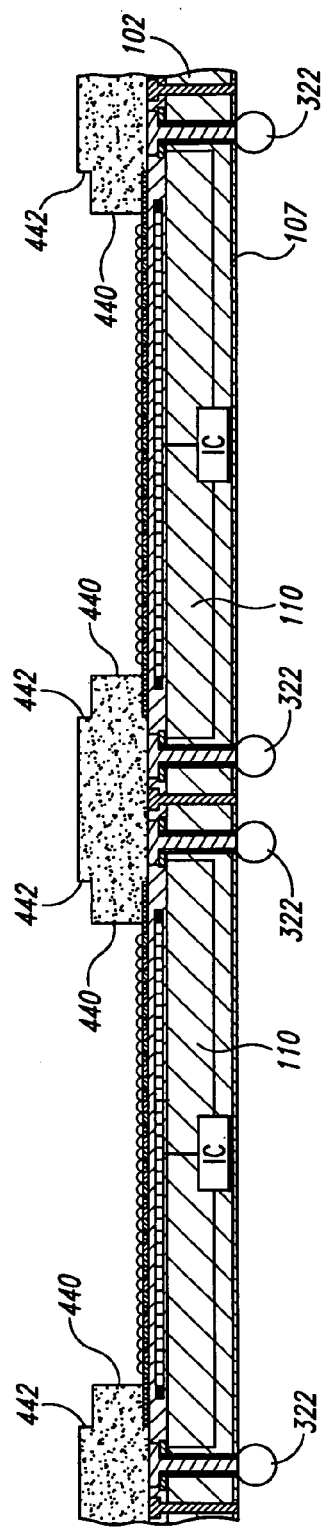
Fig. 4A
Fig. 4B

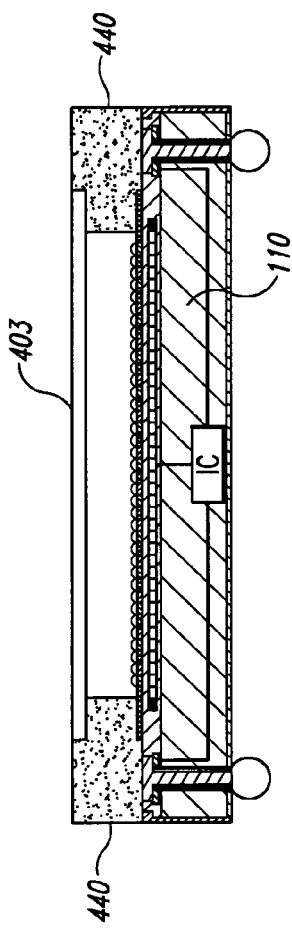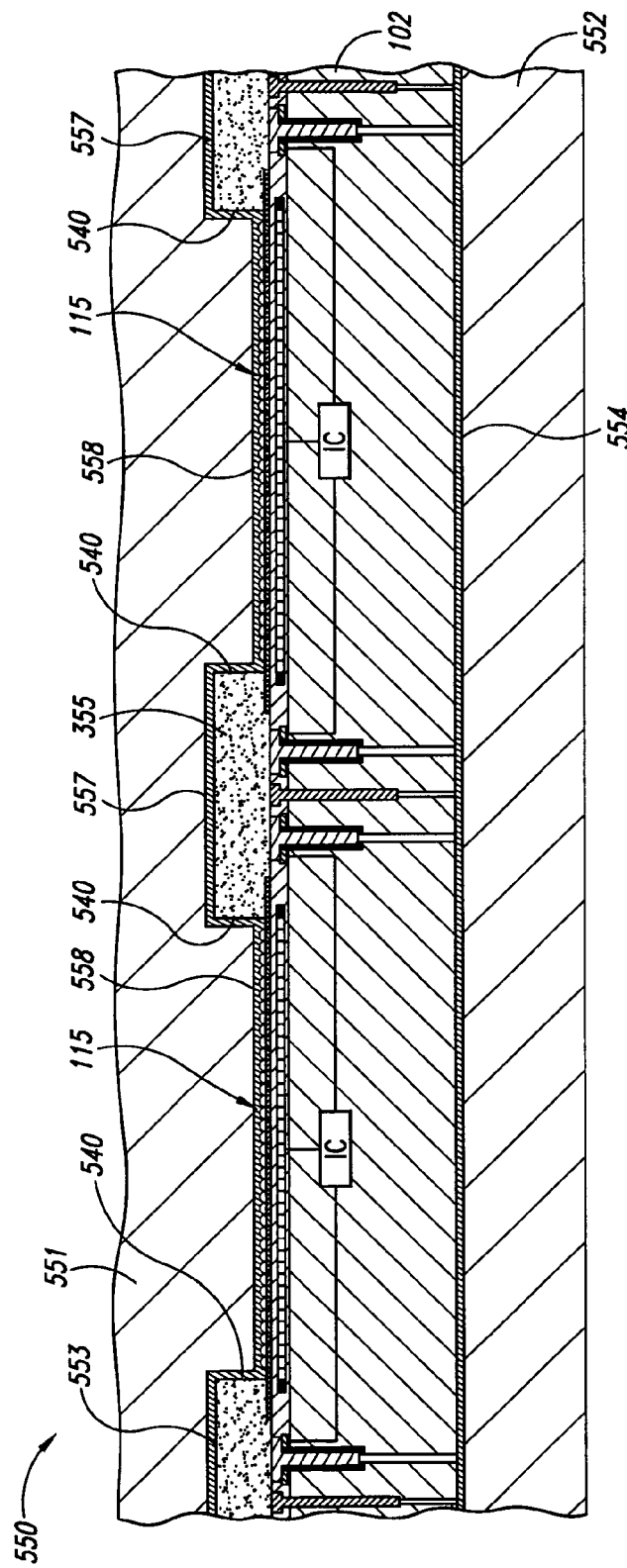

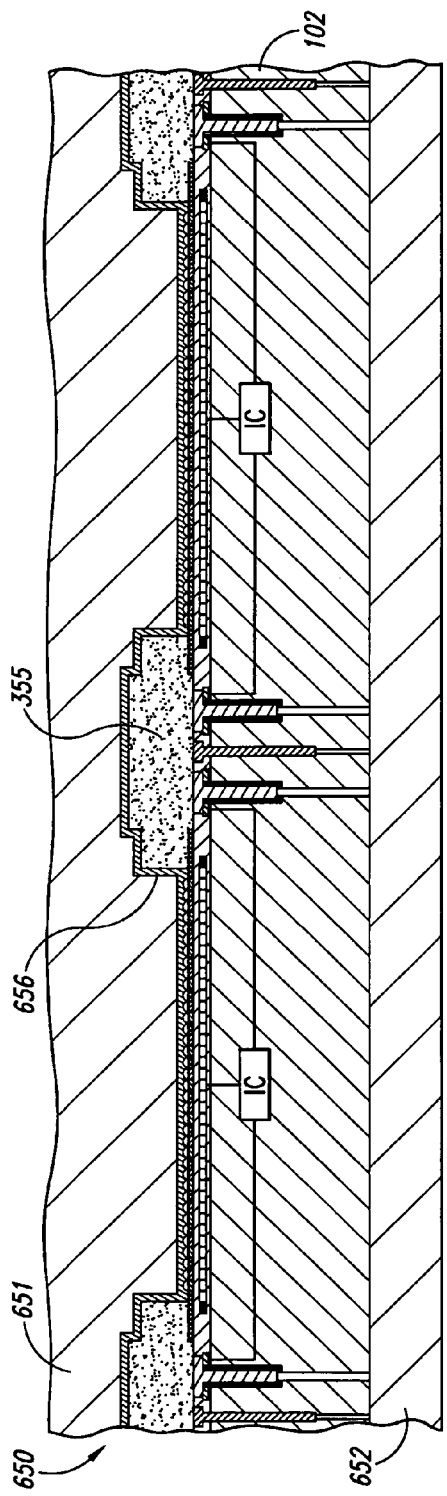
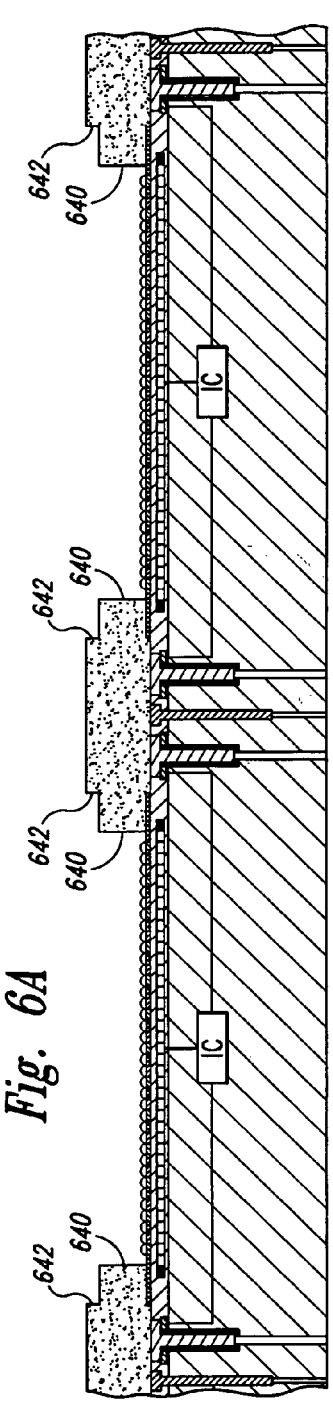
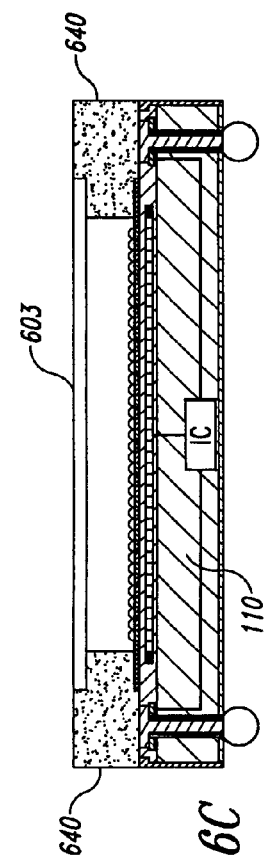
Fig. 6A
Fig. 6B
Fig. 6C

MICROELECTRONIC IMAGING DEVICES AND ASSOCIATED METHODS FOR ATTACHING TRANSMISSIVE ELEMENTS

TECHNICAL FIELD

The present invention is directed generally toward microelectronic imaging devices and associated methods for attaching transmissive elements, including methods for forming standoffs and attaching transmissive elements at the wafer level.

BACKGROUND

Microelectronic imagers are used in digital cameras, wireless devices with picture capabilities, and many other applications. Cell phones and personal digital assistants (PDAs), for example, are incorporating microelectronic imagers for capturing and sending pictures. The growth of microelectronic imagers has been steadily increasing as they become smaller and produce better images with higher pixel counts.

Microelectronic imagers include image sensors that use Charge Coupled Device (CCD) systems, Complementary Metal-Oxide Semiconductor (CMOS) systems, or other solid-state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect their delicate components and to provide external electrical contacts.

An image sensor generally includes an array of pixels arranged in a focal plane. Each pixel is a light sensitive element that includes a photogate, a photoconductor, or a photodiode with a doped region for accumulating a photo-generated charge. Microlenses and color filter arrays are commonly placed over imager pixels. The microlenses focus light onto the initial charge accumulation region of each pixel. The photons of light can also pass through a color filter array (CFA) after passing through the microlenses and before impinging upon the charge accumulation region. Conventional technology uses a single microlens with a polymer coating, which is patterned into squares or circles over corresponding pixels. The microlens is heated during manufacturing to shape and cure the microlens. Use of microlenses significantly improves the photosensitivity of the imaging device by collecting light from a large light-collecting area and focusing the light onto a small photo-sensitive area of the sensor.

Manufacturing image sensors typically includes "post-processing" steps that occur after the microlens array is formed on a workpiece. Accordingly, it is necessary to protect the microlens array during these post-processing steps to prevent the microlens array from becoming contaminated with particles that might be released during these steps. One approach to addressing the foregoing manufacturing challenge is to attach individual image sensor dies to a substrate, tape over the corresponding sensor arrays, and then use a molding process to form "standoffs" to which a cover glass is mounted. The cover glass can accordingly protect the image sensor during subsequent processing steps, and becomes part of the sensor package.

One drawback with this approach is that it is performed at the die level and accordingly cannot protect the sensor arrays during processing steps that occur before the dies have been singulated from a corresponding wafer or other larger workpiece. Another drawback with this approach is that a mold release agent is typically used to release the die from the mold machine in which the standoffs are formed. However, the mold release agent tends to inhibit the adhesion of adhesive compounds, which are required to attach the cover glass. Accordingly, the standoff surfaces must typically be cleaned (e.g., with a plasma process) before attaching the cover glass. This additional cleaning step increases the cost of manufacturing the die, and reduces manufacturing throughput.

BRIEF DESCRIPTION OF THE DRAWINGS

FIGS. 3A-3K illustrate a process for forming imager devices at the wafer level via a protective removable cover material and a single transmissive element.

FIGS. 4A-4C illustrate a method for forming imager devices using multiple transmissive elements and a protective removable cover material in accordance with another embodiment of the invention.

FIGS. 5A-5C illustrate a method for protecting sensitive portions of an imager wafer with a mold, and applying a single transmissive element to multiple dies in accordance with another embodiment of the invention.

FIGS. 6A-6C illustrate a method for protecting sensitive portions of an imager wafer with a mold using multiple transmissive elements in accordance with still another embodiment of the invention.

DETAILED DESCRIPTION

Figure 1A:
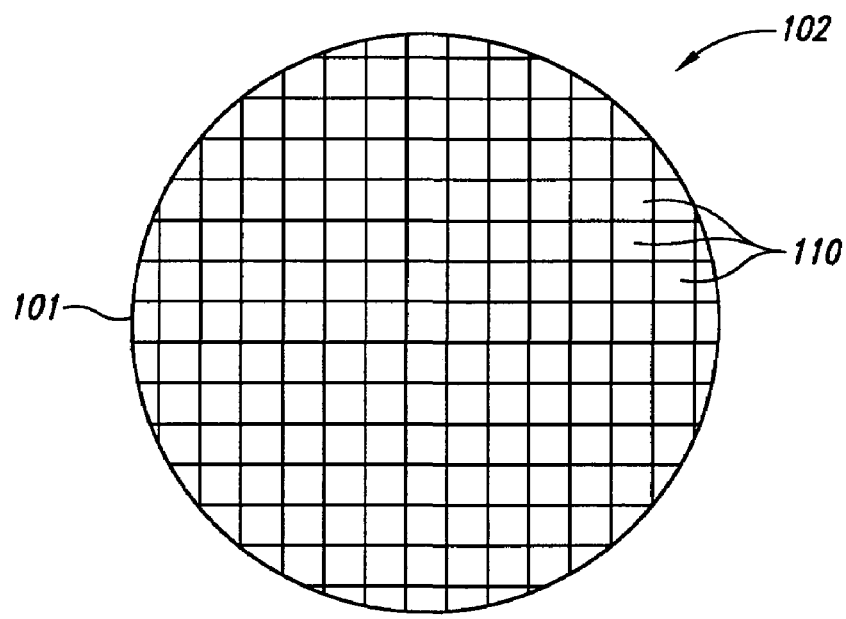
FIG. 1A illustrates a workpiece having multiple dies that may be processed and separated in accordance with an embodiment of the invention.

The following disclosure describes several embodiments of imager workpieces and corresponding methods for manufacturing a plurality of microelectronic imaging units. A method for manufacturing a plurality of microelectronic imaging units in accordance with one aspect of the invention includes providing an imager workpiece having multiple image sensor dies configured to detect energy over a target frequency range, the image sensor dies having an image sensor and a corresponding lens device positioned proximate to the image sensors. The method can, in some embodiments, further include positioning standoffs adjacent to the lens devices while the image sensor dies are connected to each other via the imager workpiece. At least one transmissive element can be attached to the workpiece at least proximate to the standoffs so that the lens devices are positioned between the image sensors and the at least one transmissive element. Individual image sensor dies can then be separated from each other.

In particular aspects of the invention, positioning the standoffs can include disposing portions of a removable cover material on the lens devices, positioning the imager workpiece in a mold, and forming the standoffs by introducing a flowable mold material into the mold and into regions between the portions of cover material. In another aspect of the invention, positioning the standoffs can include positioning the imager workpiece in a mold with cover portions of the mold positioned adjacent to the lens devices. The method can further include forming the standoffs by introducing a flowable mold material into the mold and into regions between the cover portions of the mold, while at least restricting contact between the mold material and the lens devices with the cover portions of the mold.

An imager workpiece in accordance with another aspect of the invention can include a substrate having multiple image sensor dies. The image sensor dies can have image sensors configured to detect energy over a target frequency range, and corresponding multiple lens devices positioned proximate to the image sensors. The workpiece can further include at least one transmissive element attached to the imager workpiece so that the lens devices are positioned between the corresponding image sensors and the at least one transmissive element. The at least one transmissive element can be transmissive over at least part of the target frequency range. In one aspect of the invention, the at least one transmissive element can include multiple transmissive elements, with each transmissive element positioned adjacent to a corresponding image sensor die. In another aspect of the invention, the at least one transmissive element can include a single transmissive element positioned adjacent to multiple image sensor dies.

Specific details of several embodiments of the invention are described below with reference to CMOS image sensors to provide a thorough understanding of these embodiments, but other embodiments can use CCD image sensors or other types of solid-state imaging devices. Several details describing the structures and/or processes that are well known and often associated with other types of microelectronic devices are not set forth in the following description for purposes of brevity. Moreover, although the following disclosure sets forth several embodiments of different aspects of the invention, several other embodiments of the invention can have different configurations or different components than those described below. Accordingly, the invention may have other embodiments with additional elements or without several of the elements described below with reference to FIGS. 1-6C.

FIG. 1A illustrates a workpiece 102 carrying multiple dies (e.g., imager dies) 110. The workpiece 102 can be in the form of a wafer 101 or other substrate at which the dies 110 are positioned. Many processing steps can be completed on the dies 110 before the dies 110 are separated or singulated to form individual imaging devices. This approach can be more efficient than performing the steps on singulated dies 110 because the wafer 101 is generally easier to handle than are the singulated dies 110. As discussed in greater detail below, the dies 110 can include sensitive and/or delicate elements, and accordingly, it may be advantageous to protect these elements during the wafer-level processing steps.

Figure 1B:
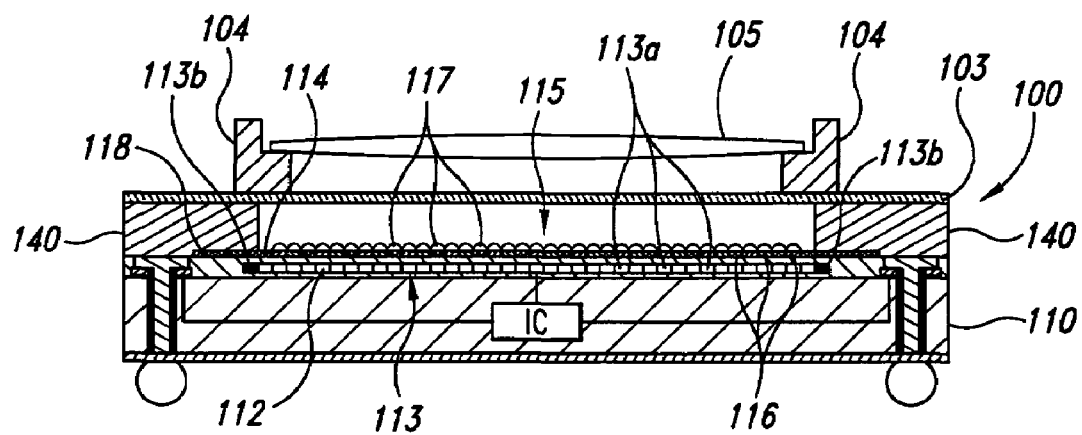
FIG. 1B illustrates an imager device that includes a die singulated from the workpiece shown in FIG. 1A.

FIG. 1B illustrates a finished, singulated imaging device 100 after being processed in accordance with an embodiment of the invention. The imaging device 100 can include a die 110 singulated from the workpiece 102 described above with reference to FIG. 1A. The die 110 can include an image sensor 112, which can in turn include an array of pixels 113 arranged in a focal plane. In the illustrated embodiment, for example, the image sensor 112 can include a plurality of active pixels 113a arranged in a desired pattern, and at least one dark current pixel 113b located at a perimeter portion of the image sensor 112 to account for extraneous signals in the die 110 that might otherwise be attributed to a sensed image. In other embodiments, the arrangement of pixels 113 may be different.

A color filter array (CFA) 114 is formed over the active pixels 113 of the image sensor 112. The CFA 114 has individual filters or filter elements 116 configured to allow the wavelengths of light corresponding to selected colors (e.g., red, green, or blue) to pass to each pixel 113. In the illustrated embodiment, for example, the CFA 114 is based on the RGB color model, and includes red filters, green filters, and blue filters arranged in a desired pattern over the corresponding active pixels 113a. The CFA 114 further includes a residual blue section 118 that extends outwardly from a perimeter portion of the image sensor 112. The residual blue section 118 helps prevent back reflection from the various components within the die 110.

The imaging device 100 can further include a plurality of microlenses 117 arranged in a microlens array 115 over the corresponding pixels 113. The microlenses 117 are used to focus light onto the initial charge accumulation regions of the individual pixels 113. Standoffs 140 are positioned adjacent to the microlens array 115 to support a transmissive element 103. The transmissive element 103 (which can include glass) is positioned to protect the microlens array 115 and other features of the die 110 from contamination. Lens standoffs 104 can be mounted to the transmissive element 103 to support a device lens 105. The device lens 105 is positioned a selected distance from the microlens array 115 to focus light onto the microlens array 115 and ultimately onto the image sensor 112. As discussed in greater detail below, the standoffs 140 and the transmissive element 103 can be formed on the die 110 before the die 110 is singulated from the workpiece 102 (FIG. 1A) and before many processing steps are completed on the die 110. Accordingly, the transmissive element 103 can protect the underlying sensitive features of the die 110 during these subsequent processing steps.

Figure 2A:
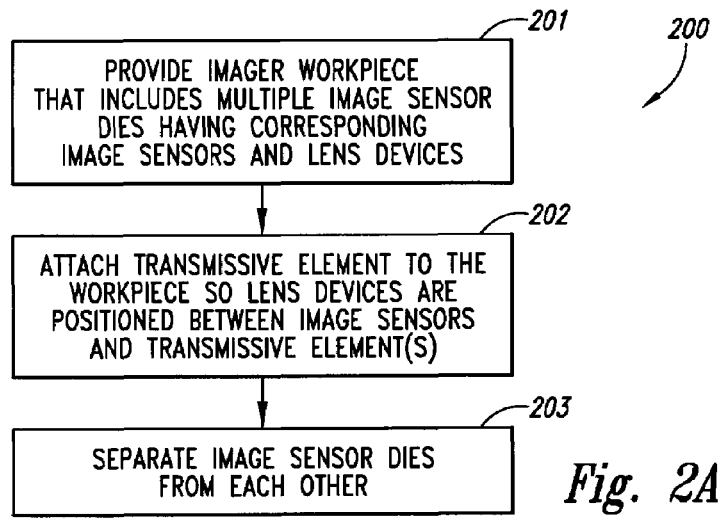
FIGS. 2A-2B are flow diagrams illustrating methods for processing a workpiece in accordance with an embodiment of the invention.

FIG. 2A illustrates a process 200 for manufacturing imager devices in accordance with an embodiment of the invention. The process 200 can include providing an imager workpiece that includes multiple image sensor dies having corresponding image sensors and lens devices (process portion 201). The process can further include attaching at least one transmissive element to the workpiece so that lens devices of the workpiece are positioned between the image sensors and the transmissive element or elements (process portion 202). The process can still further include separating or singulating the image sensor dies from each other (process portion 203) after the transmissive element or elements have been attached to the workpiece. Accordingly, the lens devices carried by the workpiece can be protected by the transmissive element(s) during singulation and, optionally, during other processes, including (but not limited to) backgrinding the workpiece and attaching conductive elements to the workpiece.

Figure 2B:
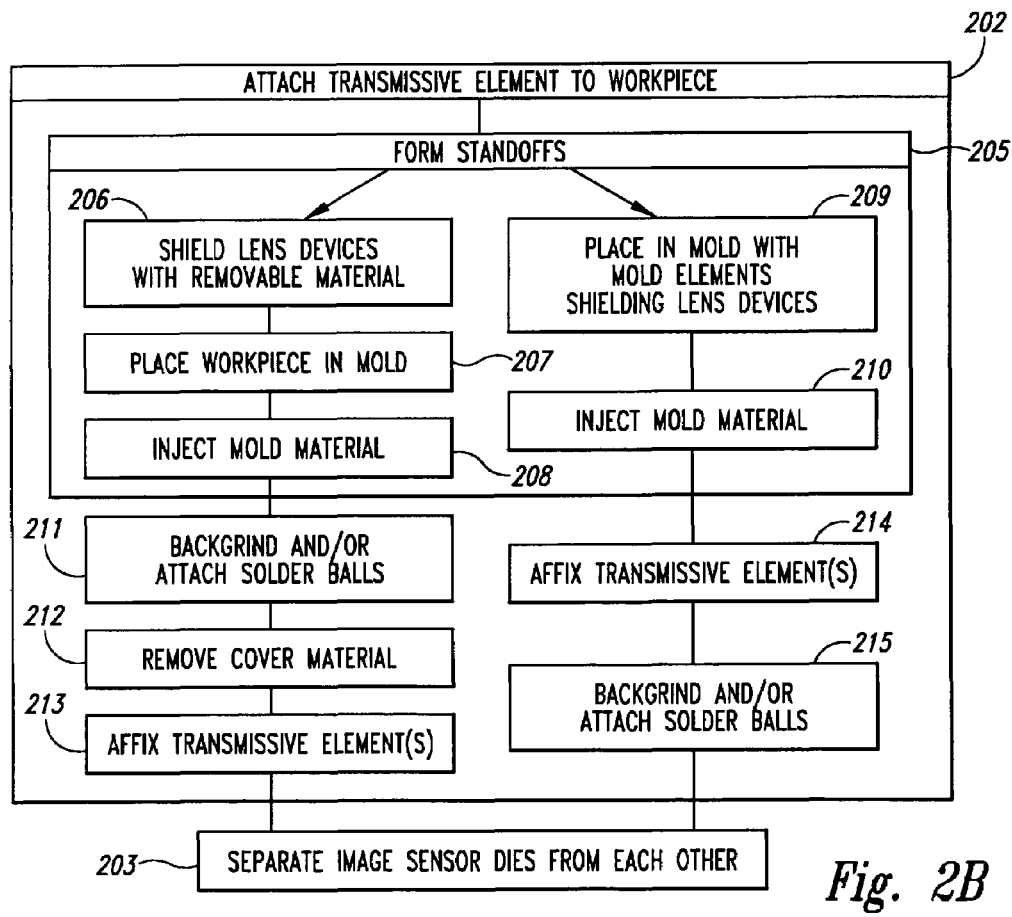

FIG. 2B illustrates further details of particular embodiments of the process described above with reference to FIG. 2A. In particular, the process of attaching one or more transmissive elements to the workpiece (process portion 202) can include forming standoffs (process portion 205) before affixing the transmissive elements. Forming the standoffs can be accomplished in one of at least two different ways. One way can include shielding the lens devices of the workpiece with a removable cover material (process portion 206), placing the workpiece in a mold (process portion 207), and injecting a mold material into the mold (process portion 208). After the mold material has been applied to the workpiece, the workpiece is removed from the mold. The workpiece can then be background and solder balls or other conductive elements can be attached to the backside of the workpiece (process portion 211). These processes can be conducted while the removable material is in place. In process portion 212, the removable cover material or shield material can be removed, and in process 213, the transmissive element or elements can be affixed to the workpiece.

Another method for shielding the lens devices of the workpiece includes placing the workpiece in a mold with elements of the mold itself positioned to shield the lens devices (process portion 209). Accordingly, the mold elements can take the place of the removable material described above with reference to process portion 206. For example, in process portion 210, mold material is injected into the mold to form standoffs, while the mold elements shield the lens devices and prevent (or at least restrict) contact between the mold material and the lens elements. In process portion 214, one or more transmissive elements are attached to the workpiece after the workpiece has been removed from the mold. Once the transmissive elements are in place, the workpiece can be background and solder balls or other conductive elements can be attached to the back side of the workpiece (process portion 215). After forming the standoffs, affixing one or more transmissive elements, and post-processing the workpiece (e.g., by backgrinding the workpiece and/or attaching conductive elements to the workpiece), individual image sensor dies can be separated from each other (process portion 203).

FIGS. 3A-3K illustrate a method for processing imager dies while the dies remain attached to each other (e.g., at the wafer level). The process illustrated in FIGS. 3A-3K uses a removable mold material and a single transmissive element that covers multiple dies at the wafer level. In other embodiments, the removable material can be replaced by portions of the mold itself, and/or the single transmissive element can be replaced with multiple transmissive elements, each positioned over one of the imager dies. Further details of these other embodiments are described below with reference to FIGS. 4A-6C.

Beginning with FIG. 3A, the workpiece 102 (only a portion of which is shown in FIG. 3A) can include multiple dies 110, still attached to each other. Each die 110 can have a first surface 106, a second surface 107, and integrated circuitry 111 coupled to an image sensor 112. A color filter array 114 can be positioned adjacent to the image sensor 112 to filter incoming radiation in a manner generally similar to that described above. The image sensor 112 can include multiple pixels 113, including active pixels 113a and dark current pixels 113b. A microlens array 115 is positioned adjacent to the color filter array 114 and includes multiple microlenses 117 that focus incoming radiation in a manner generally similar to that described above. Each die 110 can further include interconnect structures 320 for electrical communication with external devices. Each interconnect structure 320 can include a terminal 321 electrically coupled to the integrated circuitry 111. The interconnect 320 can also include a blind hole 325 and a vent hole 324. The blind hole 325 can be filled with a conductive material 326 to provide electrical access to the integrated circuitry 111 via the second surface 107, after material is removed from the second surface 107. The vent hole 324 can allow for easy entry of the conductive material 326 into the blind hole 325.

The workpiece 102 can further include a scribe street 330 positioned between each die 110 to delineate adjacent dies 110 from each other and to provide a medium for a subsequent singulation process. The scribe street 330 can include a scribe street slot 331 connected to a through-wafer vent hole 333 and filled with a fill material 332. The fill material 332 can include a non-conductive material that is disposed within the scribe street slot 331 prior to performing additional processes on the workpiece 102. In another embodiment, the scribe street slot 331 can be filled during a molding process, which is described in greater detail below with reference to FIG. 3D.

As shown in FIG. 3B, a removable cover material 141 can be blanketed over the first surface 106 of the workpiece 102. The removable cover material 141 can include a photoresist or other selectively removable substance. Accordingly, portions of the cover material 141 can be selectively removed (as shown in FIG. 3C) using a masking process or other suitable process, leaving the remaining portions of cover material 141 only over the microlens arrays 115. The remaining cover material portions 141 can protect the microlens arrays 115 during subsequent processing steps. In a particular aspect of this embodiment, the remaining cover material portions 141 do not cover the dark current pixels 113b, which allows these pixels to be covered by mold material, as described below.

Referring next to FIG. 3D, the workpiece 102 can be positioned in a mold 350, between a lower mold portion 352 and an upper mold portion 351. The lower mold portion 352 can include a removable layer of lower mold tape 354, and the upper mold portion 351 can include a removable layer of upper mold tape 353. The lower mold tape 354 and upper mold tape 353 can prevent direct contact between the mold material and the mold surfaces to allow the workpiece 102 to be easily removed after the molding process.

During the molding process, a mold material 355 is injected into the mold 350 to fill the regions between the portions of cover material 141. Accordingly, the mold material 355 can form the standoffs 140 between the microlens arrays 115 of neighboring dies 110. The standoffs 140 can be positioned to cover the dark current pixels 113b so that these pixels do not receive radiation during normal use. If the scribe street slot 331 between neighboring dies 110 was not previously filled with a fill material, the mold material 355 can fill the scribe street slot 331 during the molding process. After the molding process, the upper mold portion 351 and the lower mold portion 352 are moved away from each other allowing the workpiece 102 to be removed.

FIG. 3E illustrates the workpiece 102 after it is removed from the mold 350 and inverted for backgrinding. During the backgrinding process, a grinder 360 removes a selected thickness of material from the second surface 107. In one aspect of this embodiment, the selected thickness can be one that exposes an end 334 of the scribe street 330, without exposing the ends 327 of the interconnect structures 320.

Figure 3G:
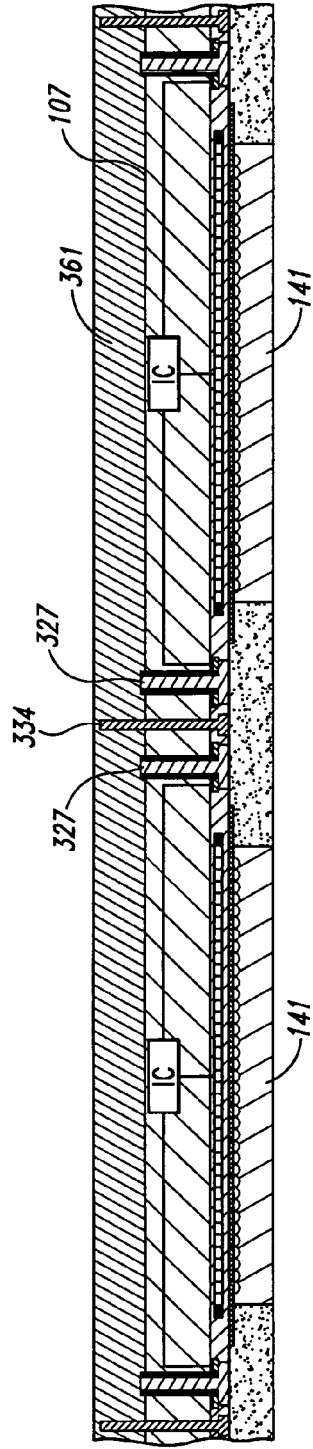
Figure 3H:
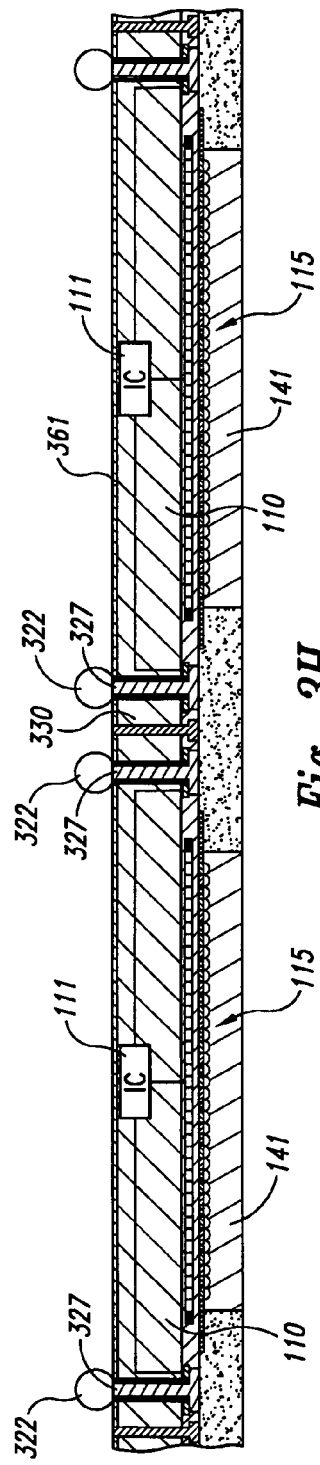

As shown in FIG. 3F, an etching process or other selective removal process can be used to remove further material from the second surface 107 so that the interconnect ends 327 project from the second surface 107, with the scribe street end 334 projecting from the second surface 107 by a greater distance. A protective coating 361 (FIG. 3G) can be applied to the second surface 107 to cover the interconnect ends 327 and the scribe street end 334. As shown in FIG. 3H, the protective coating 361 and the scribe street 330 can be ground or etched so that the interconnect ends 327 are again exposed. The manufacturer can then attach connectors 322 (e.g., solder balls) to the interconnect ends 327 to provide for electrical communication with the integrated circuitry 111 located within each of the dies 110. During the foregoing processes (e.g., the backgrinding process and the connector attachment process), the protective cover material 141 remains in place over the microlens arrays 115 to prevent particulates and/or other contaminants from contacting the microlens arrays 115.

Figure 3I:
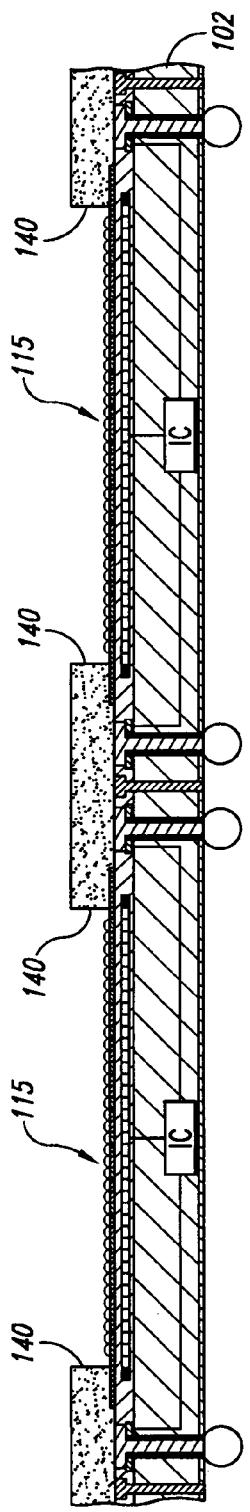

FIG. 3I illustrates the workpiece 102 after the cover material 141 has been removed via a suitable process (e.g., an etching process). After the cover material 141 has been removed, the standoffs 140 remain in position adjacent to each of the microlens arrays 115. Because the mold material forming the standoffs 140 abutted the tape layers 353, 354 described above with reference to FIG. 3D, the exposed surfaces of the standoffs 140 have not been coated with a mold release agent. Accordingly, the standoffs 140 are ready to be attached to a transmissive member (e.g., a cover glass) without first requiring that a release agent be removed from the standoffs 140.

FIG. 3J illustrates the transmissive element 103 attached to the standoffs 140 with attachment elements 308. The attachment elements 308 can include adhesive layers in one embodiment. In another embodiment, the surface of each of the standoffs 140 adjacent to the transmissive element 103 can be softened or otherwise activated so that the mold material 355 itself attaches directly to the transmissive element 103. In any of these embodiments, after the transmissive element 103 has been attached to the workpiece 102, a dicing wheel 362 or other separating tool can be aligned with the scribe street 330 and activated to separate neighboring dies 110 from each other.

FIG. 3K illustrates a singulated die 110 having standoffs 140 that carry a singulated portion of the transmissive element 103 to protect the underlying sensitive structures. At this point, the sides 309 of the die 110 can be treated to remove residual material (e.g., residual scribe street material), and the resulting device 100 can be completed by attaching lens standoffs 104 and a device lens 105 and (both shown in FIG. 1B) adjacent to the transmissive element 103.

One feature of an embodiment of the process described above with reference to FIGS. 3A-3K is that several steps of the process can be completed on multiple dies 110 while the dies 110 remain attached to the corresponding workpiece 102, e.g., at the wafer level. These processes can include, but are not limited to a backgrinding process and a connector attachment process. During these processes, the microlens arrays 115 and underlying sensitive imager structures can be protected by the removable cover material 141. Accordingly, these processes can be completed without damaging the microlens arrays 115 and underlying structures. In addition, the standoffs 140 formed by the mold process can be positioned to cover the dark current pixels 113b. Accordingly, a separate step need not be employed to cover these pixels. An advantage of the foregoing processes is that it may be more efficient and therefore cost effective to carry out the processes at the wafer level rather than at the die level. Another advantage is that the wafer is easier to handle and less subject to breakage than are individual dies 110. Accordingly, by carrying out these processes at the wafer level, the number of steps requiring handling individual dies 110 can be reduced, which can in turn reduce the number of dies 110 that are damaged or destroyed during these process steps.

Another advantage of using the mold process described above is that the height of each of the standoffs 140 can be precisely controlled by controlling the manufacture of the mold 350 and the relative spacing of the upper and lower mold portions 351, 352 during the molding process. As a result, the location of the device lens 105 relative to the microlens array 115 can also be precisely controlled and can ensure that radiation is precisely focused on the microlens array 115. This process can also be used to ensure that the distance between the microlens array 115 and the transmissive element 103 exceeds a threshold value. Accordingly, contaminants (should they exist) on the surface of the transmissive element 103 may tend to create shadows that are out of focus and/or blurry. The effect of such contaminants on the pixels 113 can therefore be reduced.

Another feature of embodiments of the foregoing processes is that they can include forming molded standoffs without the use of a mold release agent. Instead, a layer of releasable tape (having an inwardly facing, non-stick surface) can be applied to the mold to prevent adhesion between the mold and the mold material. An advantage of this arrangement is that it can eliminate the step of cleaning the standoffs prior to adhering the transmissive element(s) to the standoffs. Accordingly, this approach can reduce processing time and increase throughput, whether it is performed at the wafer level or on individual dies.

FIGS. 4A-4C illustrate a process that is generally similar to the process described above with reference to FIGS. 3A-3K, but includes disposing multiple transmissive elements (e.g., one for each die) rather than a single transmissive element that covers multiple dies. For purposes of brevity, many of the steps described above with reference to FIGS. 3A-3K are not repeated in the discussion below. Beginning with FIG. 4A, the workpiece 102 can be positioned in a mold 450 having a lower mold portion 452 carrying a lower mold tape 454, and an upper mold portion 451 carrying an upper mold tape 453. The upper mold portion 451 can include mold cutouts 456 and a vacuum process can be used to conform the upper mold tape 453 to the contours of the upper mold 451. When the mold material 355 is injected into the mold 450 between adjacent portions of the cover material 141, it extends into and fills the mold cutouts 456 and forms correspondingly shaped standoffs 440.

FIG. 4B illustrates the workpiece 102 after (a) it has been removed from the mold 450, (b) the second surface 107 has been ground, (c) the connectors 322 have been attached, and (d) the cover material portions 141 have been removed. Each of the standoffs 440 includes a recess 442 sized to receive a corresponding transmissive element that is positioned adjacent to only a single one of the dies 110.

FIG. 4C illustrates one of the dies 110 after a transmissive element 403 has been attached to the standoffs 440, and after the die 110 has been singulated from the workpiece 102 (FIG. 4B). The transmissive element 403 can be attached to the corresponding standoffs 440 using any of the adhesion processes described above.

Figure 5B:
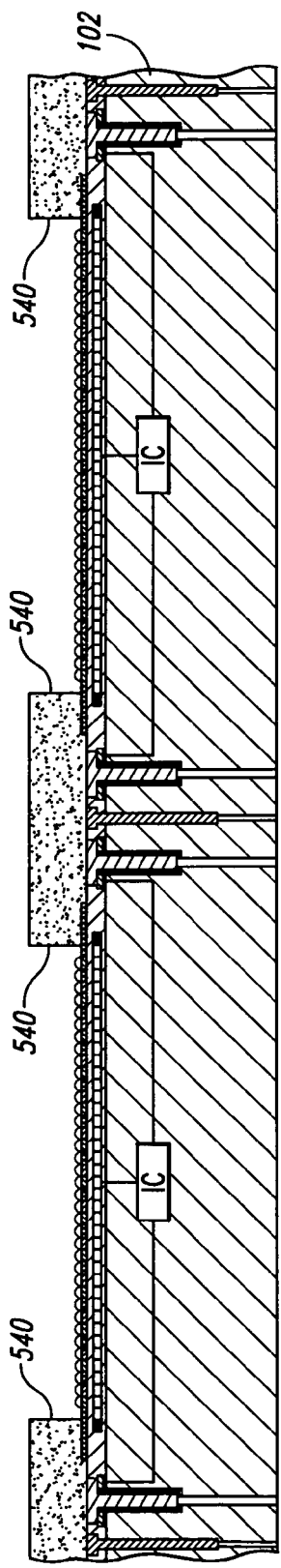
Figure 5C:
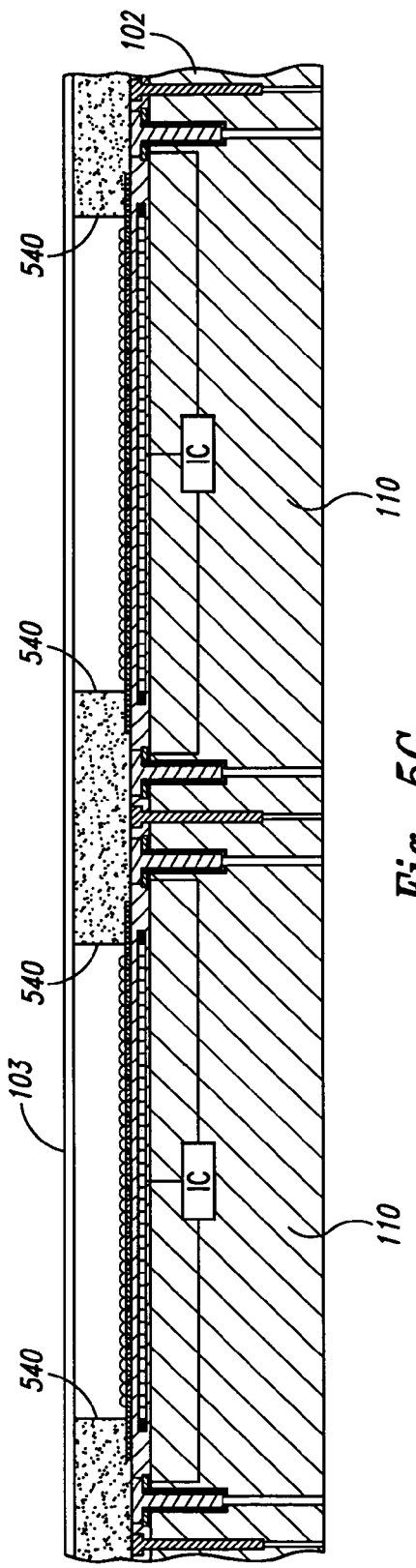

FIGS. 5A-5C illustrate a method for processing the workpiece 102 and protecting the microlens arrays 115 without the use of a removable cover material 141. Instead, the mold itself can provide protection for the microlens arrays 115. Beginning with FIG. 5A, a mold 550 can include an upper mold portion 551 having cavities 557 and intermediate projections 558 or cover portions carrying a conformal upper mold tape layer 553. The upper mold portion 551 can be positioned adjacent to a lower mold portion 552 that carries a layer of lower mold tape 554. When the workpiece 102 is positioned between the upper mold portion 551 and the lower mold portion 552, the two mold portions can be brought into proximity with each other until the projections 558 (and the upper mold tape layer 553 carried by the projections 558) contact the underlying microlens arrays 115. The mold material 355 is then injected into the mold 550 to fill the cavities 557 and form corresponding standoffs 540.

FIG. 5B illustrates the workpiece 102, with standoffs 540, after the workpiece 102 has been removed from the mold 550. FIG. 5C illustrates the workpiece 102 after the transmissive element 103 has been attached to the standoffs 540, prior to backgrinding, attaching connectors, and singulating the neighboring dies 110. These processes can be completed in a manner generally similar to that described above with reference to FIGS. 3E-3J.

FIGS. 6A-6C illustrate a process that is generally similar to that described above with reference to FIGS. 5A-5C, but is configured to apply individual transmissive elements 103 to each of the dies 110. Beginning with FIG. 6A, the workpiece 102 can be positioned in a suitable mold 650 that includes an upper mold portion 651 having mold cutouts 656. The upper mold portion 651 is positioned adjacent to a lower mold portion 652, with the substrate 102 positioned there between. The mold compound 355 is injected into the mold 650 so as to form standoffs 640, each of which has a recess 642 (FIG. 6B). Accordingly, as shown in FIG. 6C, the standoffs 640 can support individual transmissive elements 603 for each of the imager dies 110.

One feature of embodiments of the foregoing processes described above with reference to FIGS. 5A-6C is that they can include a mold that is shaped to protect sensitive portions of the workpiece during the molding process. Accordingly, these processes need not include coating portions of the workpiece with a removable cover material. An advantage of this arrangement is that it can reduce the number of process steps associated with forming the standoffs.

From the foregoing, it will be appreciated that specific embodiments of the invention have been described herein for purposes of illustration, but that various modifications may be made without deviating from the invention. For example, aspects of the invention described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. Various features associated with some of the processes described above (e.g., the formation of the interconnect structures) are described in greater detail in other pending applications assigned to the assignee of the present application. These applications include U.S. application Ser. No. 11/056,211, filed on Feb. 10, 2005 and U.S. application Ser. No. 11/217,877, filed on Sep. 1, 2005, both of which are incorporated herein in their entireties by reference. Accordingly, the invention is not limited except as by the appended claims.

We claim:

1. A method for manufacturing a plurality of microelectronic imaging units, comprising:

providing an imager workpiece having multiple image sensor dies, the image sensor dies having image sensors configured to detect energy over a target frequency range and corresponding lens devices positioned proximate to the image sensors, the image sensors including dark pixels;

attaching at least one transmissive element to the workpiece via standoffs so that the lens devices are positioned between the corresponding image sensors and the at least one transmissive element while the image sensor dies are connected to each other via the imager workpiece, the at least one transmissive element being transmissive over at least part of the target frequency range and the standoffs being positioned to cover the dark pixels in the image sensors; and separating the image sensor dies from each other after attaching the at least one transmissive element.

2. The method of claim 1 wherein attaching at least one transmissive element includes:

disposing portions of a removable cover material adjacent to the lens devices, the dark pixels not being covered by the portions of cover material;

positioning the imager workpiece in a mold; and forming the standoffs by introducing a flowable mold material into the mold and into regions between the portions of cover material.

3. The method of claim 1 wherein attaching at least one transmissive element includes:

positioning the imager workpiece in a mold, with cover portions of the mold positioned adjacent to the lens devices, the dark pixels not being covered by the cover portions of the mold; and forming the standoffs by introducing a flowable mold material into the mold and into regions between the cover portions of the mold, while at least restricting contact between the mold material and the lens devices with the cover portions of the mold.

4. The method of claim 1 wherein attaching at least one transmissive element includes attaching multiple transmissive elements with each transmissive element positioned adjacent to a corresponding image sensor die.

5. The method of claim 1 wherein attaching at least one transmissive element includes attaching a single transmissive element positioned to transmit energy to multiple image sensor dies.

6. The method of claim 1 wherein the imager workpiece includes a first surface and a second surface facing opposite from the first surface, with the image sensors positioned proximate to the first surface, and wherein the method further comprises:

placing a removable cover material adjacent to the lens devices;

removing material from the second surface of the imager workpiece while the cover material is positioned adjacent to the lens devices;

removing the cover material; and attaching the at least one transmissive element to the workpiece after removing the cover material.

* * * * *